(12) United States Patent
Park et al.

(10) Patent No.: US 6,479,848 B2
(45) Date of Patent: Nov. 12, 2002

(54) MAGNETIC RANDOM ACCESS MEMORY WITH WRITE AND READ CIRCUITS USING MAGNETIC TUNNEL JUNCTION (MTJ) DEVICES

(75) Inventors: Sang-jin Park, Pyongtaek (KR); Jung-hyun Sok, Yongin (KR); Il-sub Chung, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/756,721

(22) Filed: Jan. 10, 2001

(65) Prior Publication Data

US 2002/0122338 A1 Sep. 5, 2002

(30) Foreign Application Priority Data

Feb. 3, 2000 (KR) .............................................. 00-5489

(51) Int. Cl.[7] .......................... H01L 29/76; H01L 29/94; H01L 31/062; H01L 31/113; H01L 31/119
(52) U.S. Cl. ........................ 257/295; 257/296; 257/298
(58) Field of Search ............................... 257/295, 296, 257/298

(56) References Cited

U.S. PATENT DOCUMENTS

| 5,640,343 A | * | 6/1997 | Gallagher et al. | .......... 365/171 |
| 5,793,697 A | * | 8/1998 | Scheuerlein | .......... 365/230.07 |
| 5,946,228 A | * | 8/1999 | Abraham et al. | .......... 365/173 |

* cited by examiner

*Primary Examiner*—David Nelms
*Assistant Examiner*—Andy Huynh
(74) *Attorney, Agent, or Firm*—Lee & Sterba, P.C.

(57) ABSTRACT

A magnetic random access memory with write and read circuits using magnetic tunnel junction (MTJ) devices wherein MTJs are arranged at cross points of word lines and read bit lines to form memory cells. After write bit lines and read bit lines are arranged parallel to each other, current bypass paths are formed allowing current to bypass the side and bottom of the MTJ. Thus, an electric field having intensity enough to change the magnetization direction of the MTJ, is applied only to each selected cell. In a write operation, the magnetization direction of a free layer in the MTJ is formed to be parallel or antiparallel to the magnetization direction of a pinned ferromagnetic layer by the current passing through the word line and the current bypass path.

3 Claims, 9 Drawing Sheets

ANTI-PARALLEL MOMENTS

FIG. 3C (PRIOR ART)

PARALLEL MOMENTS

READ '1'
WRITE '1'

ANTI-PARALLEL MOMENTS

FIG. 5B

READ '1'
WRITE '1'

PARALLEL MOMENTS

MAGNETIC RANDOM ACCESS MEMORY WITH WRITE AND READ CIRCUITS USING MAGNETIC TUNNEL JUNCTION (MTJ) DEVICES

BACKGROUND OF THE INVENTION

1. Field of the Invention

The present invention relates to a nonvolatile memory device. More specifically, the present invention relates to a magnetic random access memory with write and read circuits using magnetic tunnel junction (MTJ) devices.

2. Description of the Related Art

Figure 1:
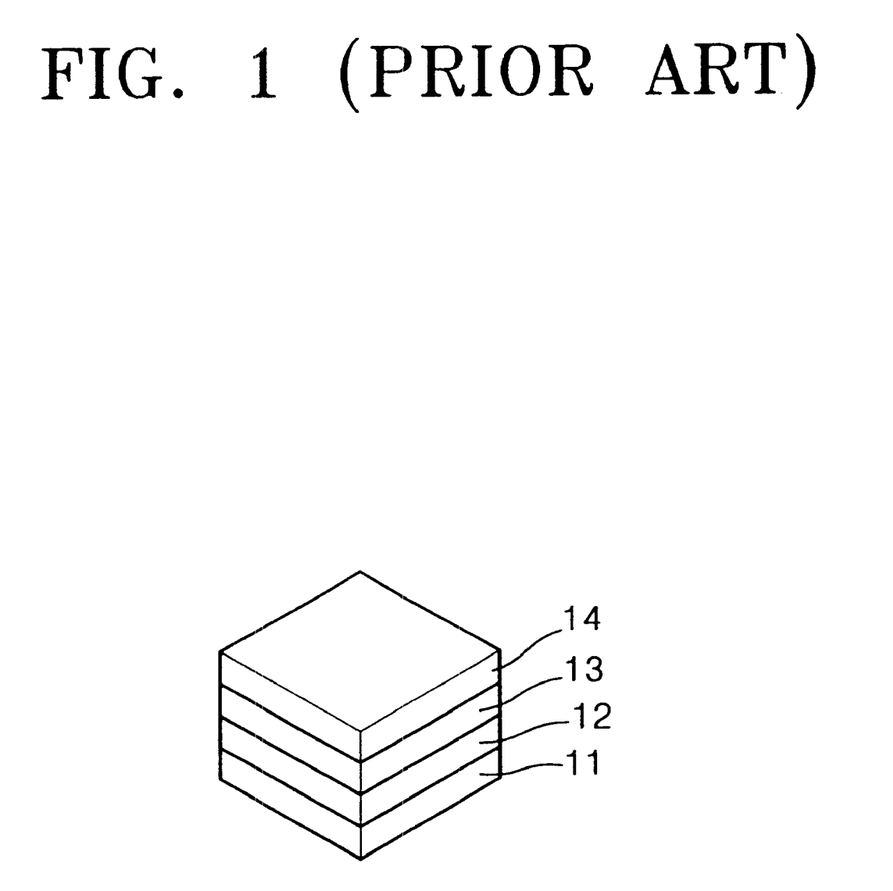
FIG. 1 illustrates the basic structure of a magnetic tunnel junction (MTJ), which is essential to a general magnetic memory cell and known in the prior art.
Figure 2:
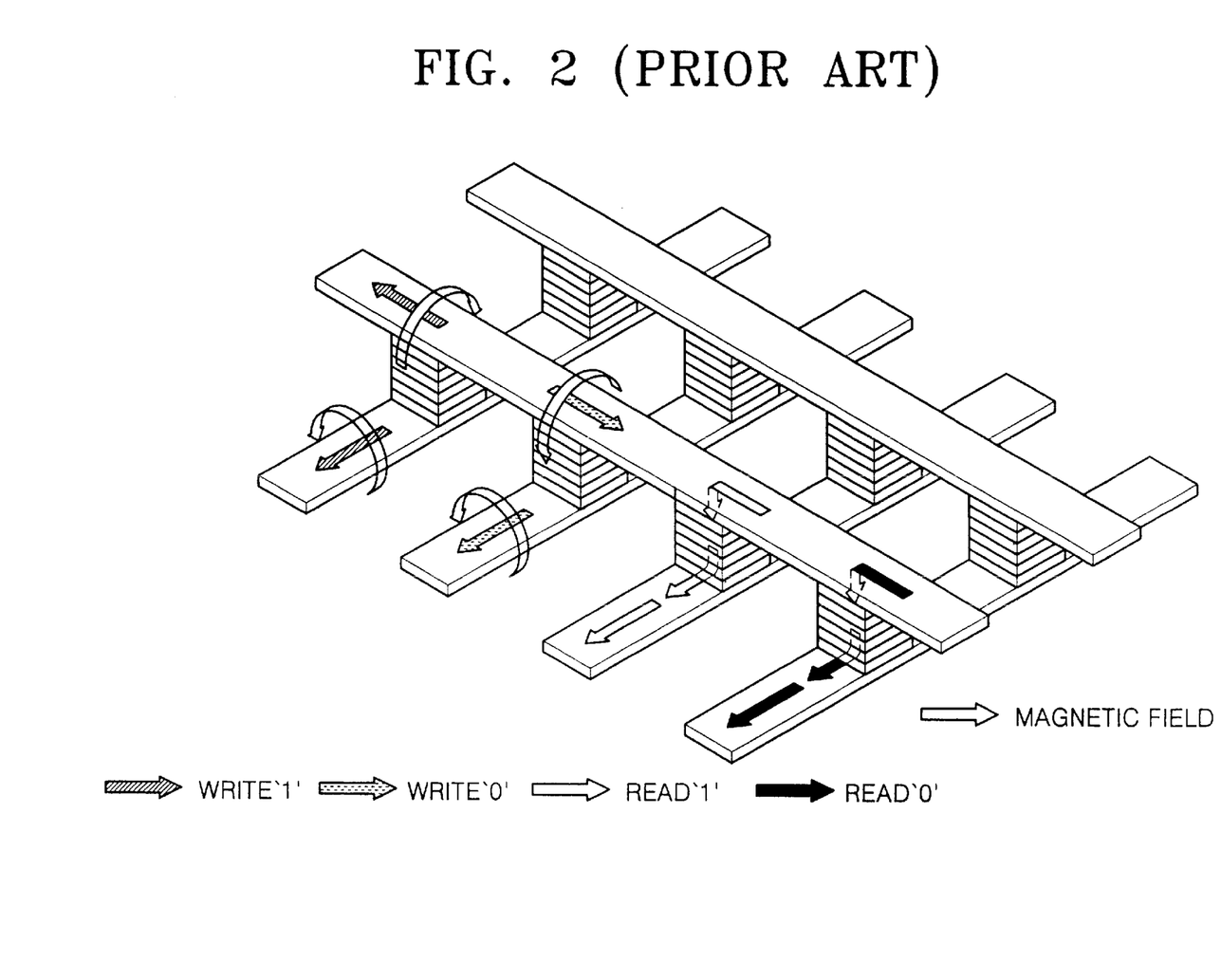
FIG. 2 illustrates the structure and operation of a conventional magnetic random access memory using MTJs.
Figure 3A:
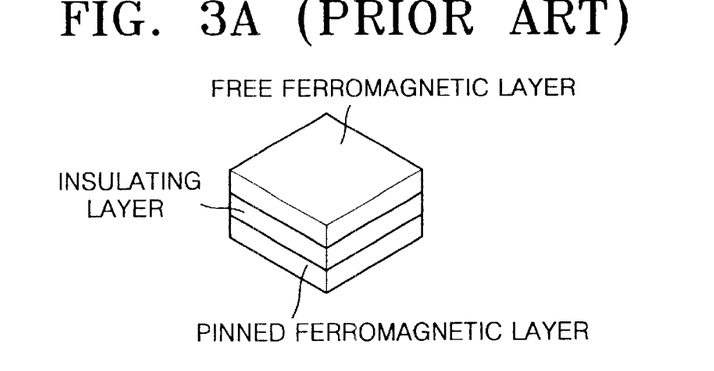
FIGS. 3A–3C illustrate each MTJ and the direction of a magnetic moment created in each ferromagnetic layer of the MTJ, according to the operation of a magnetic random access memory as shown in FIG. 2.
Figure 3B:
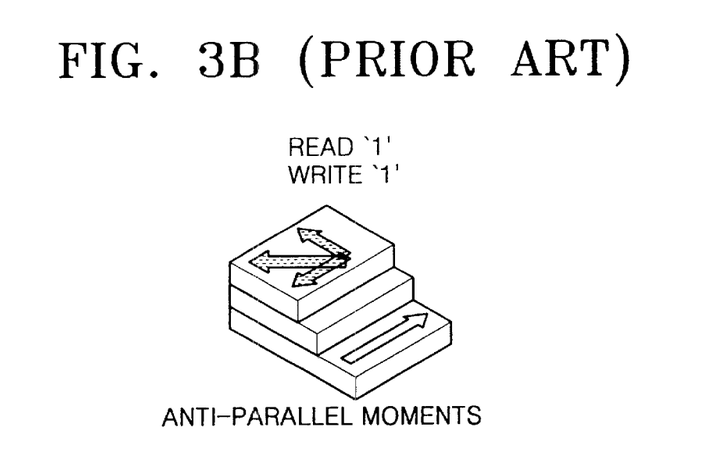
Figure 3C:
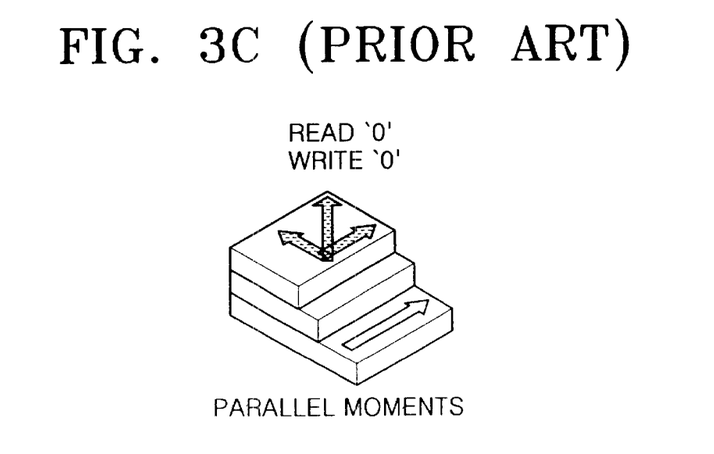

A nonvolatile magnetic random access memory is an array of individual magnetic memory cells. Each memory cell includes a magnetic tunnel junction (MTJ) device. FIG. 1 illustrates the basic structure of a MTJ device in a conventional magnetic memory cell. Referring initially to FIG. 1, each MTJ device includes a pinned ferromagnetic layer 12, the magnetization direction of which is fixed, an antiferromagnetic layer 11, for pinning the magnetization of the pinned ferromagnetic layer 12 by use of an antiferromagnetic coupling, a free ferromagnetic layer 14, the magnetization direction of which is free to rotate parallel or antiparallel to the fixed magnetization direction of the pinned ferromagnetic layer 12, and an insulating tunnel barrier 13 that is placed between the pinned ferromagnetic layer 12 and the free ferromagnetic layer 14. FIG. 2 is a perspective view that illustrates the structure of a magnetic random access memory using a conventional MTJ. (Such a conventional device is disclosed in U.S. Pat. No. 5,640,343, for example). In the magnetic memory array shown in FIG. 2, the magnetic state of a free layer of the MTJ may depend on a magnetic field induced by electric current that flows through a word line and a bit line. Accordingly, this conventional device has a problem in that the direction of a magnetic field created in the MTJ of FIG. 3A is not formed in parallel or antiparallel to the fixed magnetization of a pinned ferromagnetic layer, as illustrated in FIGS. 3B and 3C.

SUMMARY OF THE INVENTION

To solve the above problem, it is a feature of the present invention to provide a magnetic random access memory with read and write circuits using magnetic tunnel junction (MTJ) devices, wherein the magnetic random access memory can effectively change the magnetization direction of a free ferromagnetic layer in the MTJ device formed at the intersection point of word line and bit line to thereby read and write the magnetic state of the free ferromagnetic layer.

In an effort to satisfy this and other features of the present invention, there is provided a magnetic random access memory with read and write circuits using MTJ devices including word lines arranged in stripes at a regular interval, read bit lines and write bit lines that are arranged in stripes in a direction intersecting the word lines and are parallel to each other, magnetic tunnel junction devices formed to be in contact with the word lines and read bit lines at the cross points of the two lines, and current bypass paths that are coupled to the word lines and the write bit lines and are formed for allowing the current to bypass the side and the bottom of each magnetic tunnel junction device.

The current bypass paths include a via hole path, which is coupled to the word line and passes the magnetic tunneling junction devices in a vertical and downward direction, and a base path, which is coupled to the write bit lines and the via hole path and passes below the read bit line in contact with the magnetic tunneling junction device.

Each MTJ includes a pinned ferromagnetic layer, the magnetization direction of which is fixed, an antiferromagnetic layer for pinning the magnetization direction of the pinned ferromagnetic layer by use of an antiferromagnetic coupling, a free ferromagnetic layer, the magnetization direction of which is free to change in a direction parallel or antiparallel to the fixed magnetization direction of the pinned ferromagnetic layer, and an insulating tunnel barrier between the pinned ferromagnetic layer and free ferromagnetic layer.

The above and other features of the present invention will be readily apparent to those of ordinary skill in the art upon review of the detailed description that follows.

BRIEF DESCRIPTION OF THE DRAWINGS

The above feature and advantages of the present invention will become more apparent by describing in detail a preferred embodiment thereof with reference to the attached drawings in which.

DETAILED DESCRIPTION OF A PREFERRED EMBODIMENT

Korean patent application number 00-5489, filed Feb. 3, 2000, and entitled: "Magnetic Random Access Memory with Write and Read Circuits Using Magnetic Tunnel Junction (MTJ) Devices," is incorporated by reference herein in its entirety. A preferred embodiment will now be described in detail with reference to the accompanying figures.

A magnetic random access memory according to the present invention includes read and write circuits for reading and writing the magnetic state of a free ferromagnetic layer, using magnetic tunnel junction (MTJ) devices. More specifically, the subject matter of the present invention provides an architecture which enables the magnetic memory to change the magnetization direction of a free ferromagnetic layer effectively by altering the structure of a write circuit of an MTJ formed at the cross point of word and bit lines, and has random access to the cross point of the two lines.

Figure 4:
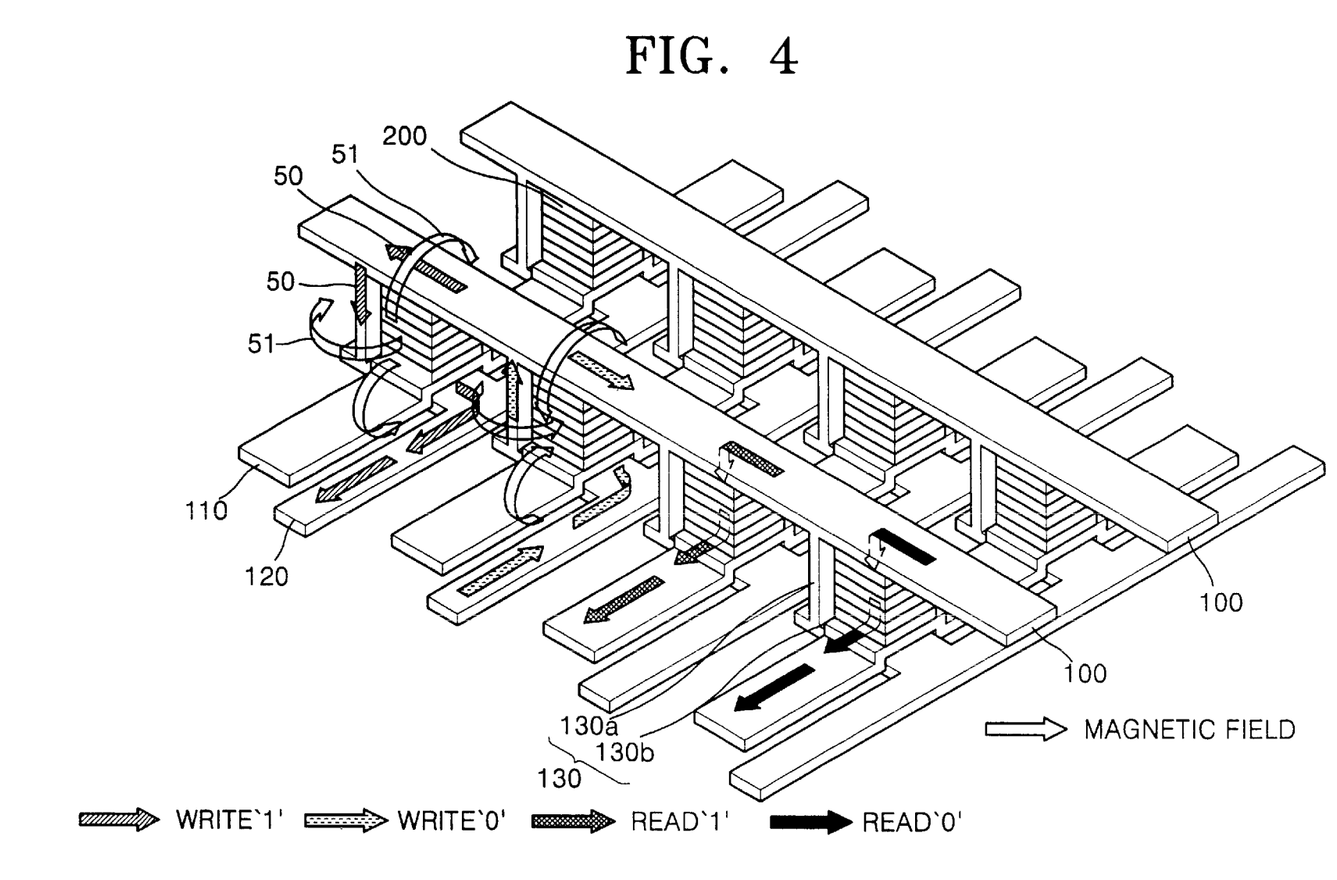
FIG. 4 illustrates the structure and operation of a magnetic random access memory with read and write circuits using MTJs according to the present invention.

Referring to FIG. 4, which is a perspective view illustrating the structure of a magnetic random access memory with read and write circuits using MTJ devices according to the present invention. The magnetic memory is characterized by forming a current bypass path 130 to allow electric current to bypass an MTJ in a write operation for writing information into the selected MTJ. Further, in order to put the current bypass path 130 into practical use, the magnetic memory according to the present invention includes two types of bit lines, i.e., read bit lines 110 and write bit lines 120. These two types of bit lines are arranged parallel to each other in stripes and in a direction perpendicular to word lines 100, which are also arranged in stripes.

In this embodiment, each MTJ is formed in such a way to be in contact with two electrodes at the intersecting region of the word line 100 and the read bit line is 110. The current bypass path 130 includes a via hole path 130a and a base path 130b. The via hole path 130a is coupled to the word line 100 and is formed in a vertical and downward direction so as to pass approximately to one side of the MTJ 200 without contact. The base path 130b is coupled to the termination part of the via hole path 130a and passes the bottom of the MTJ 200 without contact. The base path 130b additionally passes in parallel to the word lines 100 to be vertically coupled to the write bit line 120. In this embodiment, the base path 130b of the current bypass path 130 passes the bottom of the read bit line 110, to which the MTJs are directly coupled, without contact by insulating layers (not shown). Thus, the write bit line 120 is arranged parallel to the read bit line 110 on the same plane at a region deviated from the MTJ.

As described above, MTJs are disposed at each intersection region of the word and bit lines to form memory cells. The memory cells are formed to apply an electric field having enough strength to change the magnetization direction of the MTJs only to selected cells. A write bit line is formed additionally to a read bit line to allow current to bypass each selected MTJ to flow through the write bit line in a write operation, so that the magnetization direction of the free ferromagnetic layer in an MTJ is parallel or antiparallel to the fixed magnetization direction of the pinned ferromagnetic layer by the current flowing through a word line and a current bypass path. Thus, such bypass current can increase the intensity of a magnetic field, which in turn affects an MTJ. Further, this architecture enables a magnetic memory to random access a cross point in both read and write operations.

Figure 5A:
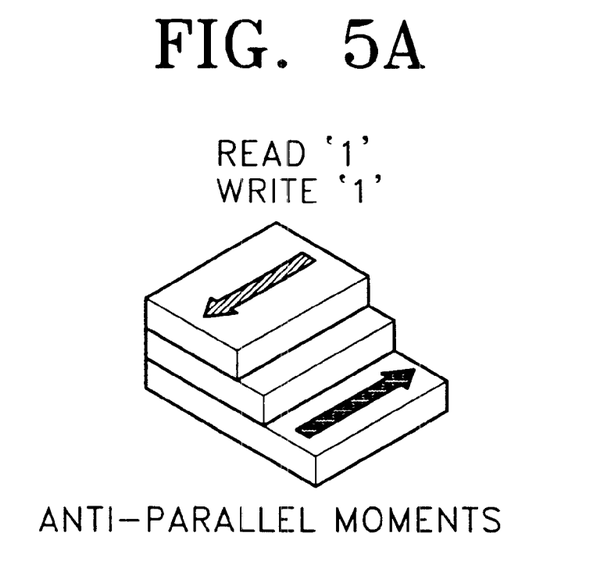
FIGS. 5A and 5B illustrate the direction of a magnetic moment formed in each magnetic layer of the MTJ according to the operation of a magnetic random access memory as shown in FIG. 4.
Figure 5B:
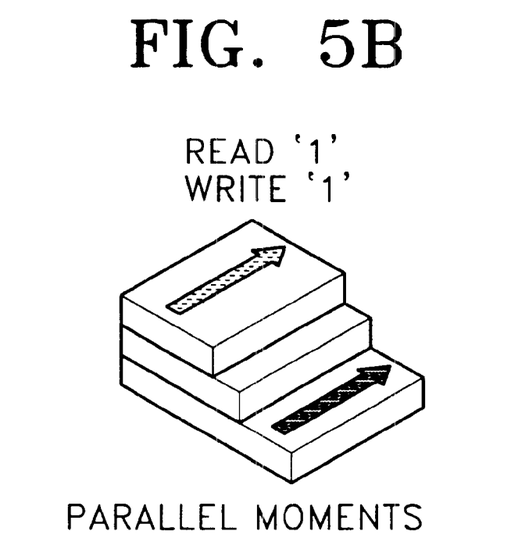

The operation of a magnetic random access memory of the above structure using the MTJs, will now be described with reference to FIG. 4. As illustrated in FIG. 4, if a write is '1', current flows in a direction of arrow 50, and the magnetic field of an MTJ cell is induced in a direction of arrow 51. In this embodiment, the spin, or magnetic moment direction, of a free ferromagnetic layer in the MTJ cell is opposite to the magnetization direction of the pinned ferromagnetic layer, and is the same as the direction of the applied magnetic field as depicted in FIG. 5A. Thus, the spin or magnetic moment direction of the free ferromagnetic layer is stored as state '1' in a memory array. On the other hand, if a write is '0', the direction of current changes oppositely, so a magnetic field whose direction is then parallel to the magnetization direction of the pinned ferromagnetic layer is induced in a direction opposite to when a write is '1', as depicted in FIG. 5B. Therefore, the spin or magnetic moment direction of the free ferromagnetic layer in a memory cell comprised of the MTJ is stored as state '0' in a memory array.

Based on the above, in a read circuit, two states '1' and '0' can be sensed by current passing through the MTJ, considering that its intensity depends on whether the spin or magnetic moments of the free ferromagnetic layer and pinned ferromagnetic layer are parallel or antiparallel to each other.

Figure 6A:
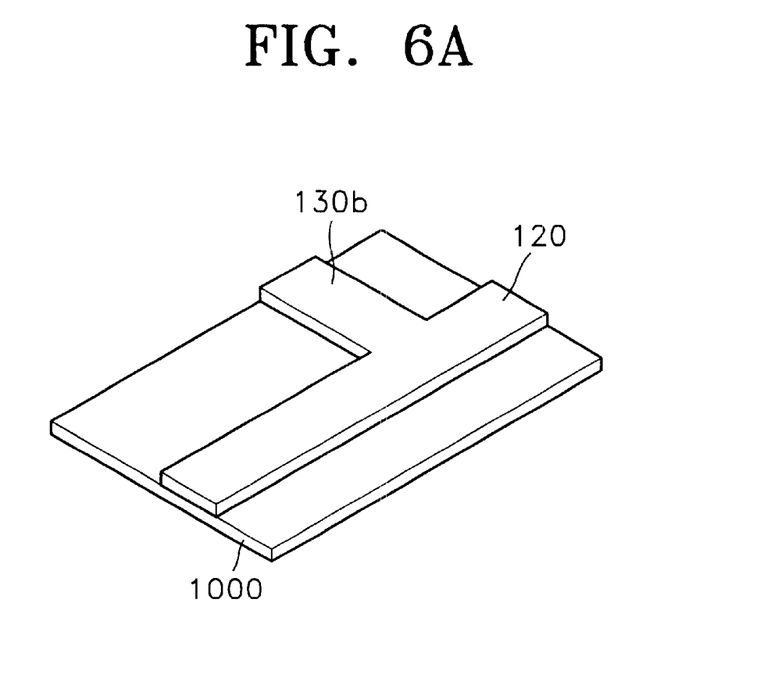
FIGS. 6A–6G are cross-sectional views illustrating the fabrication method of a magnetic random access memory with read and write circuits using MTJs at each fabrication process step.
Figure 6B:
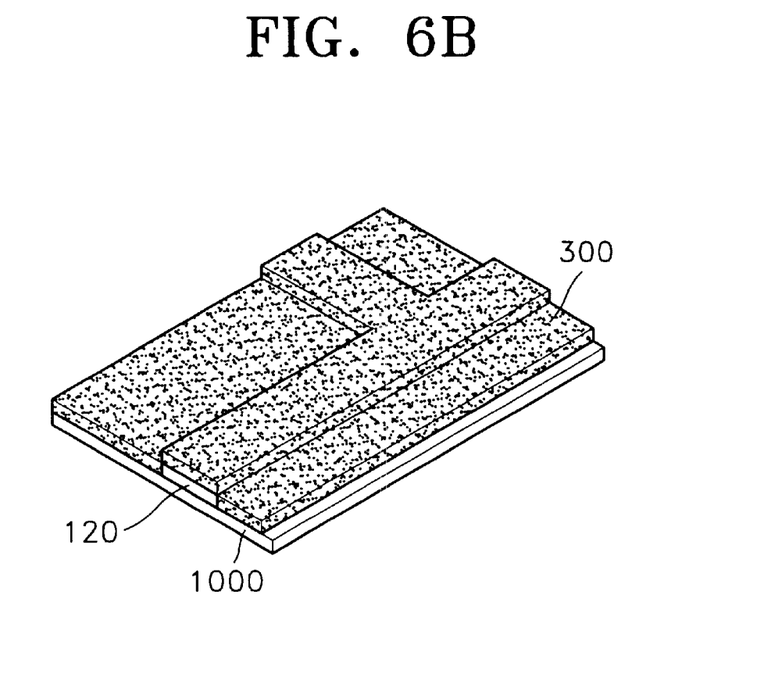

The fabrication process of a magnetic random access memory with read and write circuits using MTJs operated above, will now be described with reference to FIGS. 6A–6G. At the outset, as illustrated in FIG. 6A, a metal is deposited over a substrate 1000 and the metal is patterned to form a write bit line 120 and a base path 130b of a current bypass path. Then, as illustrated in FIG. 6B, an insulating layer 300 is coated on the top of the substrate 1000, the write bit line 120, and the base path 130b (not shown in FIG. 6B), respectively.

Figure 6C:
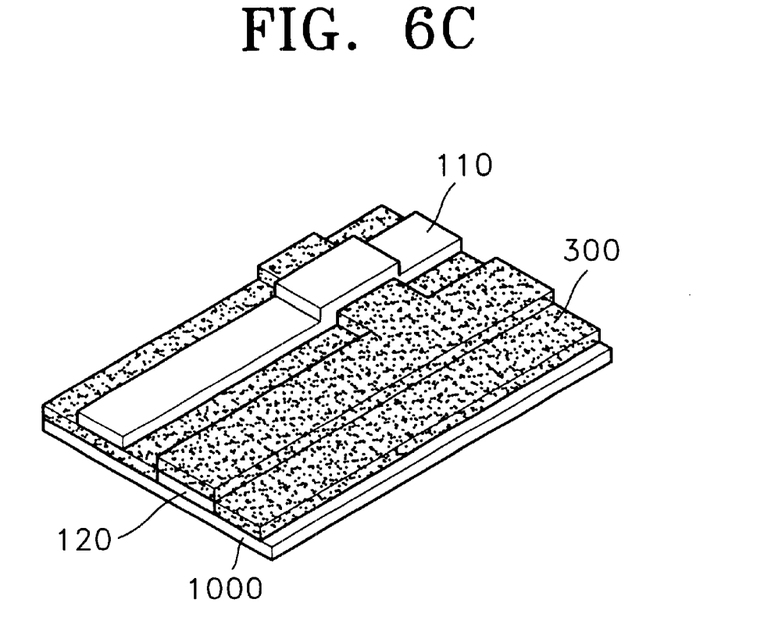
Figure 6D:
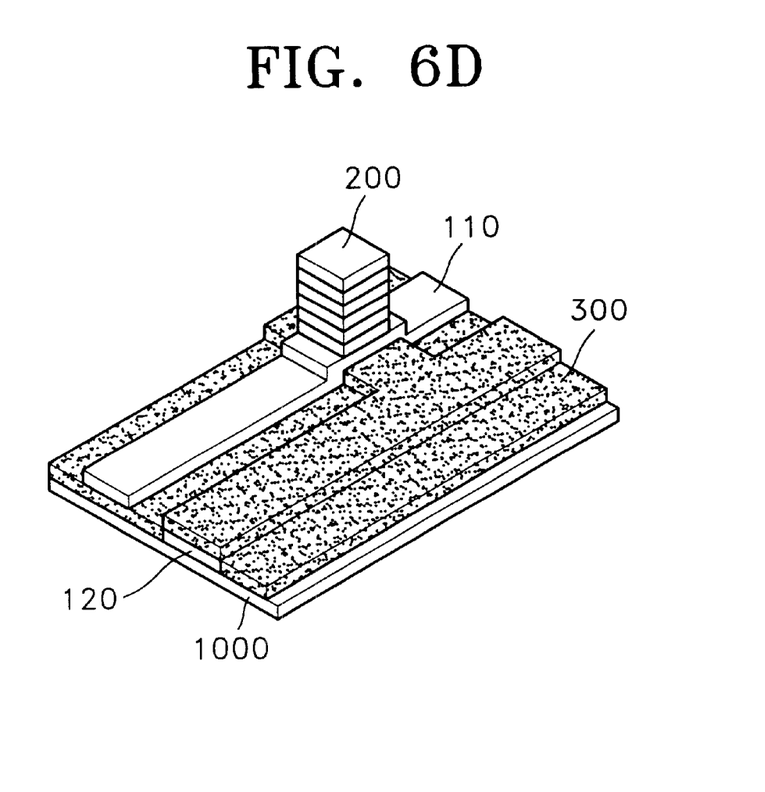
Figure 6E:
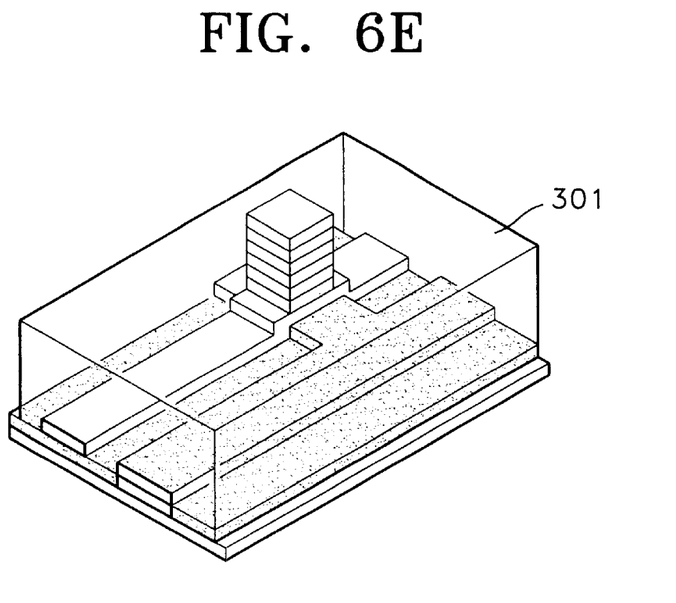
Figure 6F:
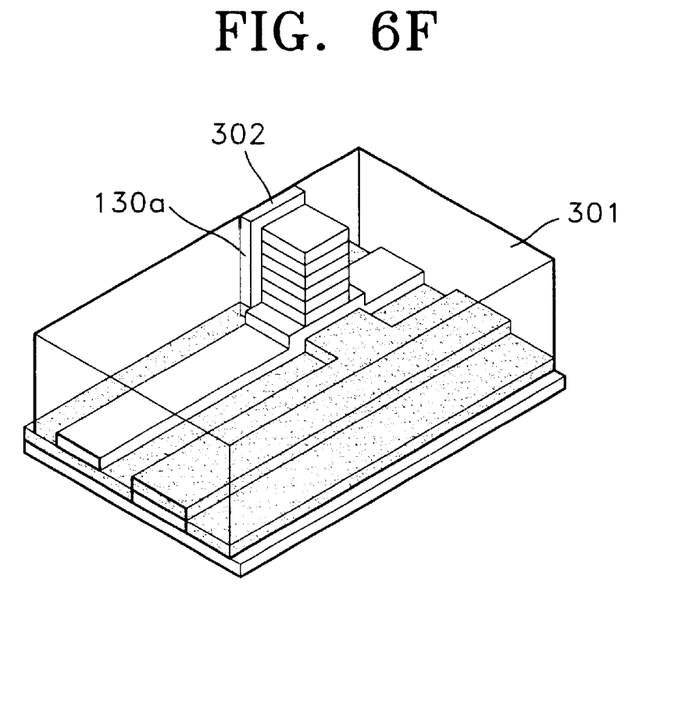

Next, as illustrated in FIG. 6C, a metal is deposited on the insulating layer 300 and the metal is patterned to form a read bit line 110 parallel to a write bit line 120. As illustrated in FIG. 6D, an MTJ device 200 is formed on the read bit line 110. Then, as illustrated in FIG. 6E, an insulating layer 301 is coated entirely so that only the top of the MTJ device 200 is exposed. As illustrated in FIG. 6F, after forming a via hole 302, a metal is deposited over the inside of the via hole 302 to form a via hole path 130a of the current bypass path.

Figure 6G:
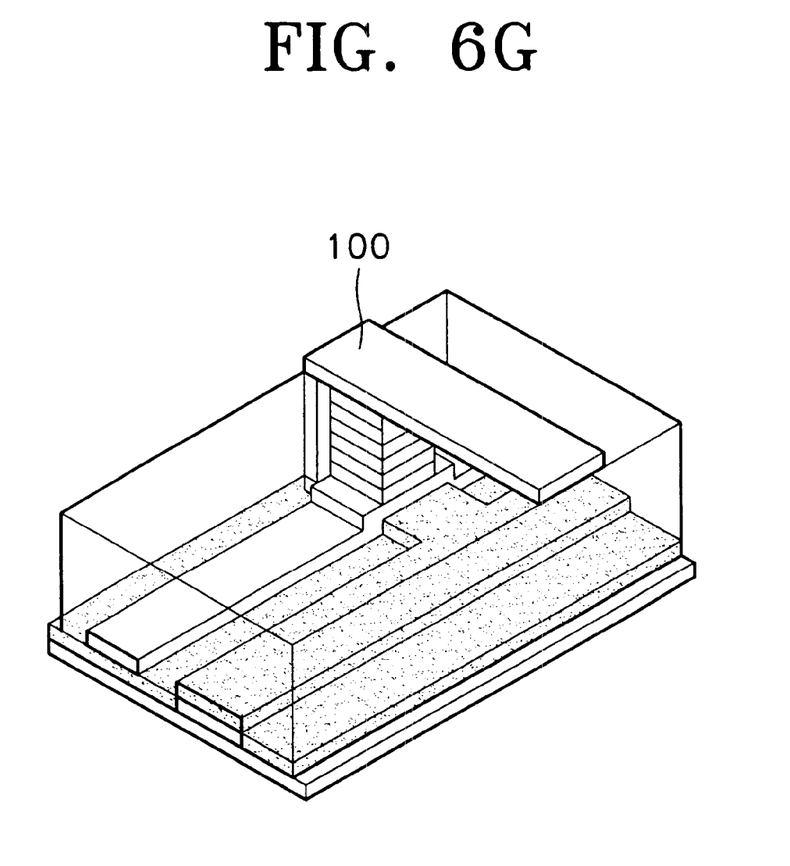

Subsequently, as illustrated in FIG. 6G, a word line 100 is formed, by depositing and patterning the metal, in a direction intersecting the two bit lines, so that the word line 100 is in contact with the tops of the via hole path 130a and the MTJ device 200.

As described in the foregoing, in a magnetic random access memory with read and write circuits using MTJ devices according to the present invention, MTJ devices are disposed at each intersecting point of word and bit lines to form memory cells. After write and read bit lines are arranged parallel to each other, a current bypass path is formed so that the current can flow from a word line to a write bit line bypassing the side and the bottom of an MTJ device. Further, an electric field having intensity such that the magnetization direction of the MTJ can be changed, is applied only to each selected cell, and in a write operation, the magnetization direction of a free layer in the MTJ is formed to be parallel or antiparallel to the magnetization direction of a pinned ferromagnetic layer by current passing through a word line and a current bypass path. The bypass current can increase the magnetic field intensity acting on the MTJ. This architecture enables the magnetic memory to random access the cross point of word and bit lines during both read and write operations.

Further, this architecture can be embodied by utilizing a lithography process for metal and dielectric, which is a deposition technique for a multilayer of magnetic materials, and a technique for manufacturing barriers and via holes.

While the present invention has been described in terms of a preferred embodiment, those of ordinary skill in the art will recognize that various modifications may be made to the invention without departing from the spirit and scope thereof.

What is claimed is:

1. A magnetic random access memory with read and write circuits using a plurality of magnetic tunnel junction devices, the magnetic random access memory comprising:

a plurality of word lines, arranged in a striped pattern at a regular interval;

a plurality of read bit lines and a plurality of write bit lines, arranged in a striped pattern in a direction intersecting at least one of the plurality of word lines, and parallel to each other;

the plurality of magnetic tunnel junction devices, each having at least one side and a bottom, formed in contact with at least one of the plurality of word lines and read bit lines at a cross point of the two lines; and a plurality of current bypass paths, each coupled to one of the plurality of word lines and one of the plurality of write bit lines, and formed to allow current to bypass a side and a bottom of one of the plurality of magnetic tunnel junction devices.

2. The magnetic random access memory as claimed in claim 1, wherein each one of the plurality of current bypass paths comprises:

a via hole path coupled to one of the plurality of word lines and passing one of the plurality of magnetic tunneling junction devices in a vertical and downward direction; and a base path coupled to one of the plurality of write bit lines and the via hole path and passes below one of the plurality of read bit lines in contact with one of the plurality of magnetic tunneling junction devices.

3. The magnetic random access memory of claim 1, wherein each of the plurality of magnetic tunneling junction device comprises:

a pinned ferromagnetic layer having a fixed magnetization direction;

an antiferromagnetic layer for pinning the magnetization direction of the pinned ferromagnetic layer by use of an antiferromagnetic coupling;

a free ferromagnetic layer having a magnetization direction that is free to change in a direction parallel or antiparallel to the fixed magnetization direction of the pinned ferromagnetic layer; and an insulating tunnel barrier between the pinned ferromagnetic layer and free ferromagnetic layer.

* * * * *